(12) United States Patent
Goebel et al.

(10) Patent No.: US 6,368,932 B1
(45) Date of Patent: Apr. 9, 2002

(54) METHOD FOR PRODUCING DIODES

(75) Inventors: Herbert Goebel; Vesna Goebel, both of Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/600,685

(22) PCT Filed: Jan. 21, 1999

(86) PCT No.: PCT/DE99/00164

§ 371 Date: Sep. 6, 2000

§ 102(e) Date: Sep. 6, 2000

(87) PCT Pub. No.: WO99/38205

PCT Pub. Date: Jul. 29, 1999

(30) Foreign Application Priority Data

Jan. 21, 1998 (DE) .......................... 198 02 090
Dec. 11, 1998 (DE) .......................... 198 57 243

(51) Int. Cl.[7] ............................................. H01L 21/20

(52) U.S. Cl. ...................... 438/380; 438/110; 438/113; 438/237; 438/460; 438/542

(58) Field of Search .............................. 438/380, 386, 438/389–391, 394, 395, 243, 254, 246–249, 328, 110–113, 141, 237, 460, 510, 542, 554, 558, 559, 562–564

(56) References Cited

FOREIGN PATENT DOCUMENTS

| DE | 4320780 | * | 3/1995 |
| DE | 43 20 780 | | 3/1995 |

* cited by examiner

*Primary Examiner*—Charles Bowers
*Assistant Examiner*—Yennhu B. Huynh
(74) *Attorney, Agent, or Firm*—Kenyon & Kenyon

(57) ABSTRACT

A method is proposed that functions to produce Zener diodes. The method includes a two-part film diffusion step for producing flatter and deeper doping profiles using neutral films.

11 Claims, 4 Drawing Sheets

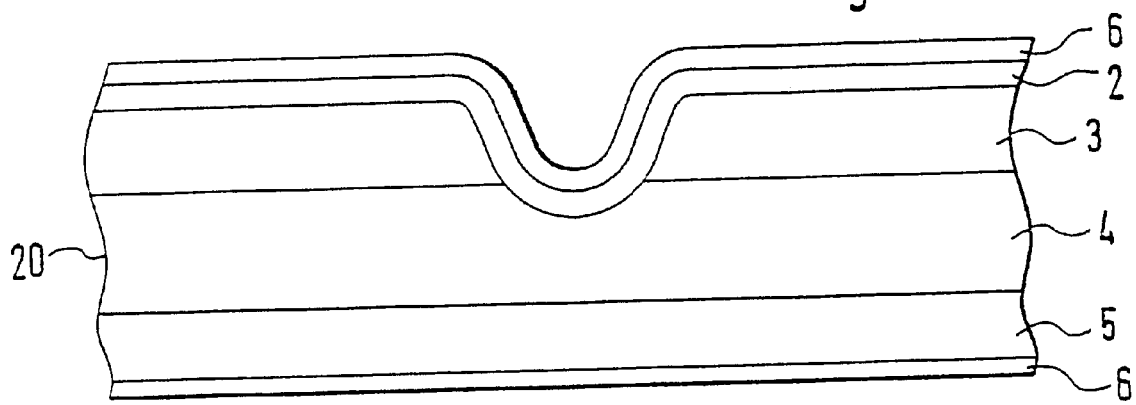
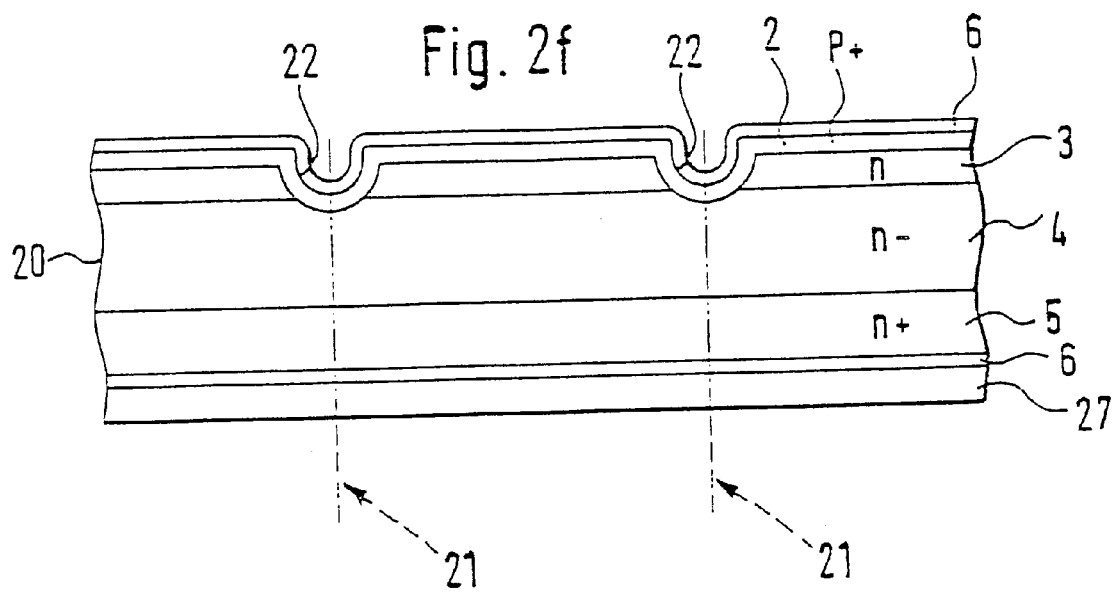

METHOD FOR PRODUCING DIODES

BACKGROUND INFORMATION

The present invention relates to a method for manufacturing diodes. A previously proposed diode manufacturing method is described in German Published Patent Application No. 43 20 780, in which doping films are used.

SUMMARY OF THE INVENTION

In contrast, the method according to the present invention has the advantage that flatter doping profiles can be generated, in which the surface concentration can be at a lower level. As a result of the fact that it is possible to generate a flat outflow of the doping concentration into the depths of the wafer, the forward voltage of the diode is lower. Similarly, the avalanche voltage at high current flows, e.g. 100 A, is made significantly smaller, i.e., the path resistance in the diode is reduced. In addition, the diode is easier to manufacture because the Zener voltage of the diode is less sensitive to certain fluctuations in response to a second diffusion in a series production, in which the actual p-n junction is produced. As a result of the fact that it is possible to produce a low surface concentration, while at the same time maintaining a deep outflow of the doping concentration, it is possible to carry out a second diffusion, in which the pn junction is produced, using a doping film that is doped at a lower level. In this manner, the Zener voltage in series production can be "met" or maintained without taking special precautions. As a result of a second doping that can be weaker, the surface of the silicon wafer is also not so intensively concentrated in impurities, so that the silicon crystal lattice is not disturbed, and therefore bending the wafer is avoided. It is additionally advantageous that the neutral film used also functions as protection during a further driving-in. The neutral film is placed onto an already doped silicon surface and, when doping atoms are once again driven in, it reliably prevents contamination of the surface, without any additional surface covering.

It is particularly advantageous to cover the upper side of the wafer using a neutral film in a second partial step, the lower side of the wafer being covered using a doping film for a very strong doping. In this manner, it is possible, on the one hand, to obtain a deep doping profile, and on the other hand, to simultaneously dope the lower side of the wafer more strongly in order to make possible an effective backside bonding of the diode.

The further application of a doping film of the opposite conductivity type makes possible a simple and also error-tolerant production of the pn junction of the diode.

BRIEF DESCRIPTION OF THE DRAWINGS

FIG. 2e depicts another method step for manufacturing.

FIG. 2f depicts another method step for manufacturing.

DETAILED DESCRIPTION

Figure 1:
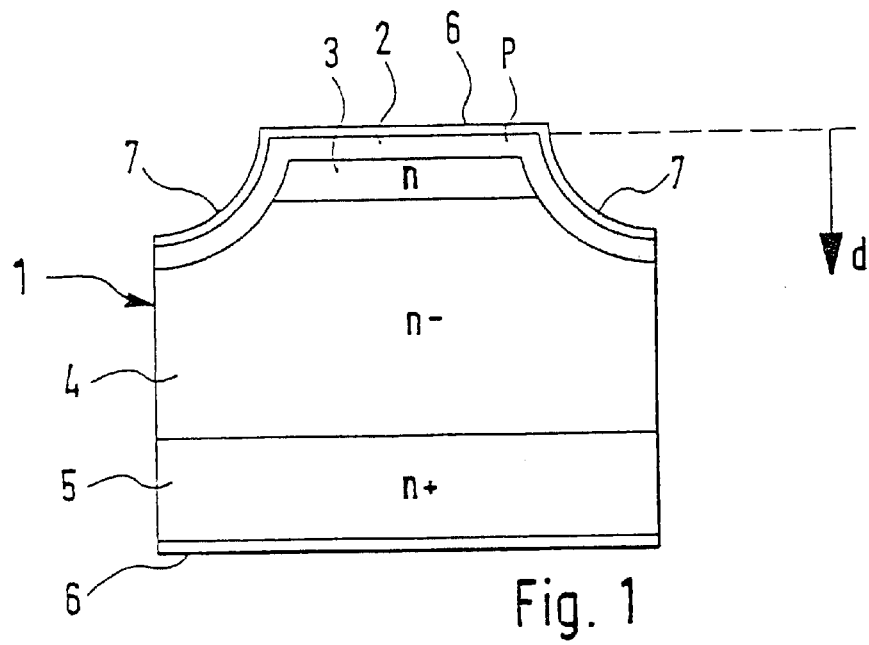
FIG. 1 depicts a Zener diode chip.

FIG. 1 depicts, in a chip 1, a Zener diode arrangement manufactured according to the method of the present invention. The chip has an n-doped layer 3, a weakly n-doped layer 4 below it, and a strongly n-doped layer 5 located below layer 4. The upper side of chip 1 is covered by a p-doped layer 2, the chip in the edge area of the upper side having steps 7, so that p-layer 2 in the middle area of the upper side covers n-layer 3, whereas in the edge area of the upper side it covers weakly n-doped layer 4. Both p-layer 2 as well as strongly n-doped layer 5 are covered by a metallic coating 6. Reference numeral d designates the penetration depths of n-doping atoms from the upper side of the wafer into the wafer interior.

Metallic coatings 6 function as anode and cathode contacts of the Zener diode, an effective backside bond being assured via strongly n-doped layer 5. The pn junction of the Zener diode is formed by the junction between layer 2 and layer 3.

FIG. 2 depicts an exemplary embodiment of the method according to the present invention. FIG. 2a depicts a wafer 20, which is covered on the upper side by a first doping film 23 and on the lower side by a second doping film 24. In this context, the first doping film functions to produce strongly n-doped layers, whereas the second doping film functions to produce very strongly n-doped layers. Wafer 20 is of the n-type and has the doping concentration of subsequent n-layer 4. Wafer 20 is stacked along with other wafers. In this context, between wafers 20 are located, in alternating fashion, the first and second doping films. The wafer stack is heated in an oxidizing atmosphere in a diffusion oven for approximately 30 minutes to three hours at approximately 1200° to 1300° C. As a result of this treatment, on the upper side a strongly n-doped covering layer 18 is formed, and on the lower side a strongly n-doped covering layer 19 is formed. Then the wafers are separated and the oxide layers that have been produced are removed. In a further step, the dopant is driven in that is laid down in covering layers 18 and 19. This also occurs through stacking the wafers, but now (FIG. 2b), in comparison to the preceding step (FIG. 2a), the front side of the wafers is covered in each case by a neutral film 25 and the back side by a very strongly n-doped doping film 24, i.e., now, neutral films and doping films 24 alternate between the wafers of the wafer stack. This wafer stack is heated in the same diffusion oven as above, in an oxidizing atmosphere, for approximately 30 to 120 hours at 1200° to 1300° C. Then, the wafers are again separated and the oxide layers that have arisen are removed. As a result of this second heating, there forms in the wafer stack n-doped layer 3 and strongly n-doped layer 5. In a further step (FIG. 2c), trenches 22 are introduced into the upper side of the wafers. This can take place through cutting or etching. Trenches 22, in this context, completely penetrate partial layer 3 and extend into layer 4. As a result of trenches 22, partition lines 21 are defined (see FIG. 2f) along which the wafer is later divided into individual Zener diode chips. The upper side of wafer 20 is therefore subdivided into square or rectangular segments (undepicted) by cutting trenches 22 that function as the edge structures of the subsequent diodes, the segments corresponding to the subsequent upper sides of the individual chips. Then the scratched wafers are rinsed in de-ionized water. In a further step (FIG. 2d), the pn junction of the diodes is produced. In this context, a film diffusion is also carried out, in that partial layer 3 is covered by a third doping film 26 of the p-type. In a diffusion time of 15–30 hours and a furnace temperature of 1200°–1300° C., a p-layer 2 forms on the upper side of the wafer, the layer covering partial layer 3 and (in trenches 22) layer 4. Even if doping film 26 does not completely coat trenches 22, but only covers it as depicted in FIG. 2d, a penetrating p-layer 2 is created in the trenches because at high temperatures the dopant exists on the wafer surface in liquid form and therefore also penetrates into the trenches. In this diffusion step, the back side of wafer 20 can optionally also be covered by second doping film 24, so that this diffusion step can also take place in the wafer stack. In a further step (FIG. 2e), the upper and lower side of wafer 20 are provided with a metallic coating 6. Then (FIG. 2f), the lower side of the wafer is bonded to a cutting film 27 and the wafer is cut through along partition lines 21, as a result of which the diodes, manufactured in parallel in the wafer composite, are separated.

Figure 2A:
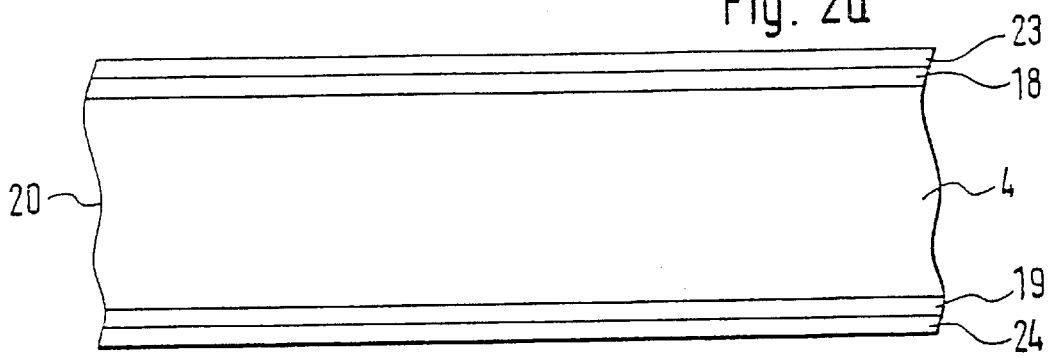
FIG. 2a depicts a method step for manufacturing.
Figure 2B:
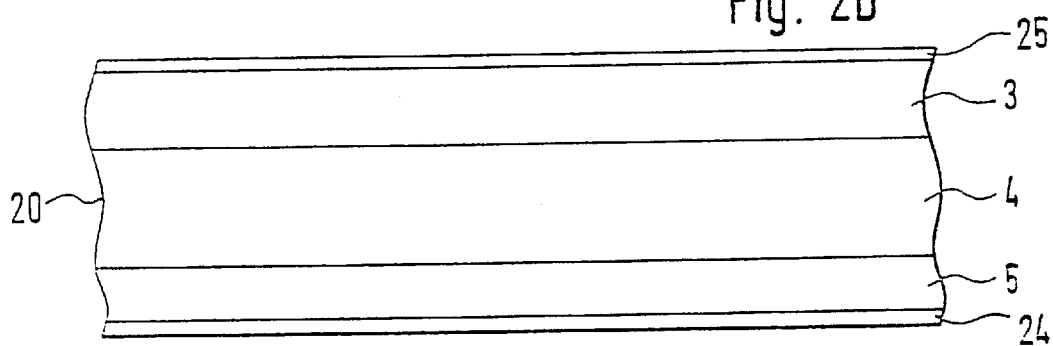
FIG. 2b depicts another method step for manufacturing.
Figure 2C:
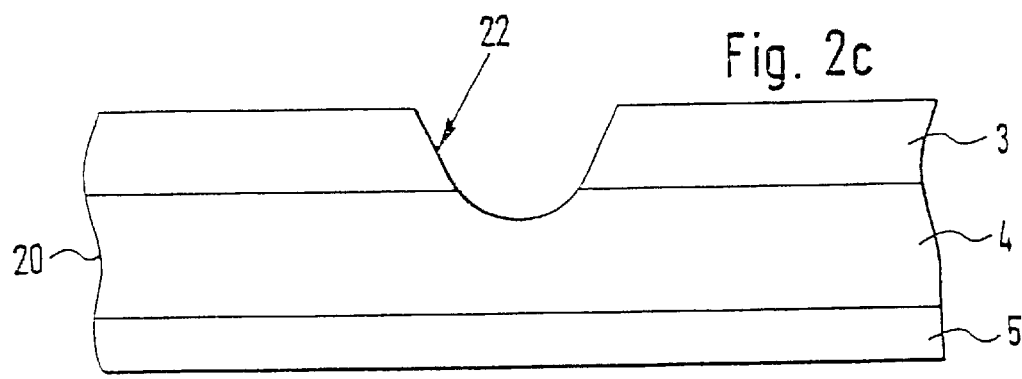
FIG. 2c depicts another method step for manufacturing.

Optionally, the method step depicted in FIG. 2b can be carried out after the introduction of trenches 22 (FIG. 2c), as a result of which, in an advantageous manner, damage to the crystal arising from the introduction of trenches 22 can be annealed out. As a p-dopant, by way of example, boron is used, and as an n-dopant phosphorus.

Optionally, the covering of the upper and lower side of wafer 20 by a strong or very strong concentration of n-doping atoms, instead of through using films (as depicted in FIG. 2a), can also take place through a gas-phase covering, a spin-on method using doping liquids, and/or through ion implantation or other generally known doping procedures.

In contrast to the modes of preceding cited as alternatives, the procedure described in FIG. 2a of a covering using doping films (in particular, in combination with a stack technology) has the advantage of being simple and therefore well-suited for large series production.

Figure 3:
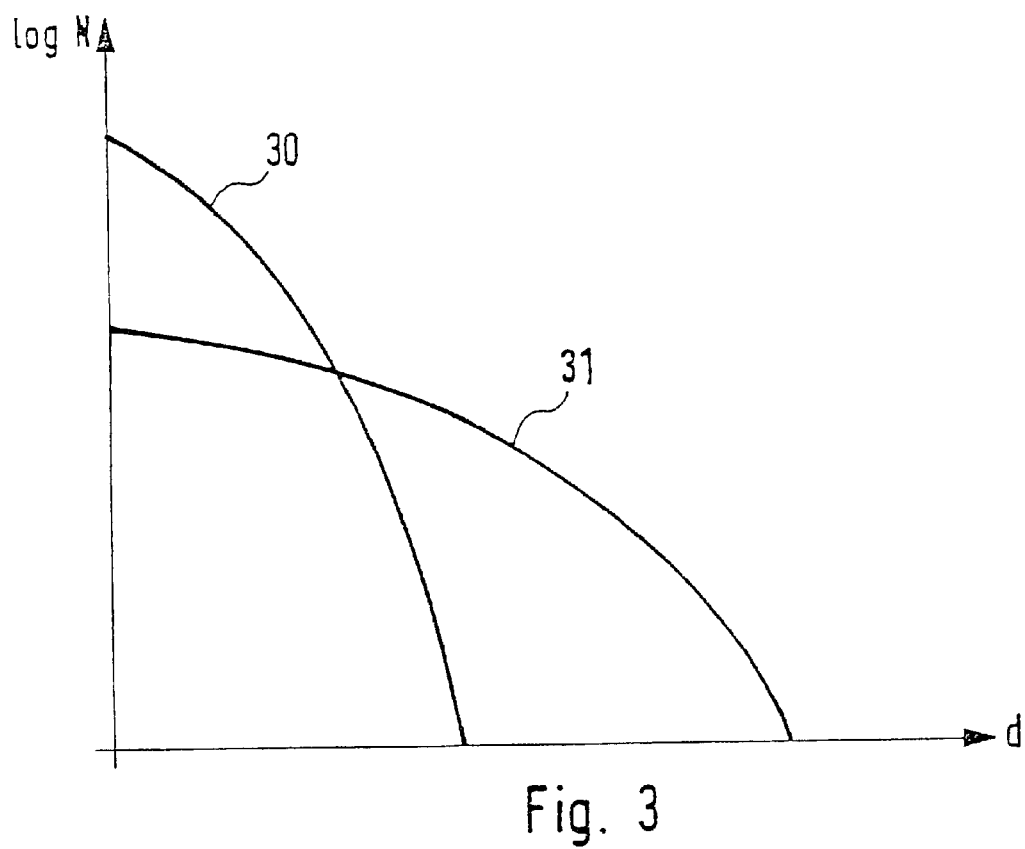
FIG. 3 depicts doping concentration curves.

FIG. 3 depicts a diagram, which represents the curve of dopant concentrations N over penetration depth d. In this context, a known doping profile 30 is contrasted to a new doping profile 31, such as can be produced using the method according to the present invention. In this context, the concentration of n-doping atoms is depicted, as revealed in their depth curve arising from the two diffusion partial steps, as depicted in FIGS. 2a and 2b. As a result of flat new doping profile 31, which extends deeply into the wafer (40–110 $\mu$m), Zener diodes are produced whose forward voltage is significantly reduced in comparison to Zener diodes having known doping profile 30. In addition, the avalanche voltage at high current flows (e.g., 100 A) is reduced by more than 20% as a result of the method according to the present invention, in comparison to the known method from German Published Patent Application No. 43 20 780. Using the method according to the present invention, diodes can be manufactured so as to be pulse-fixed, having a low forward voltage and a small dispersion of the Zener voltage. In this context, as a result of the homogenous covering using doping films and through the deep driving-in using neutral films, a high yield can be achieved.

Figure 4:
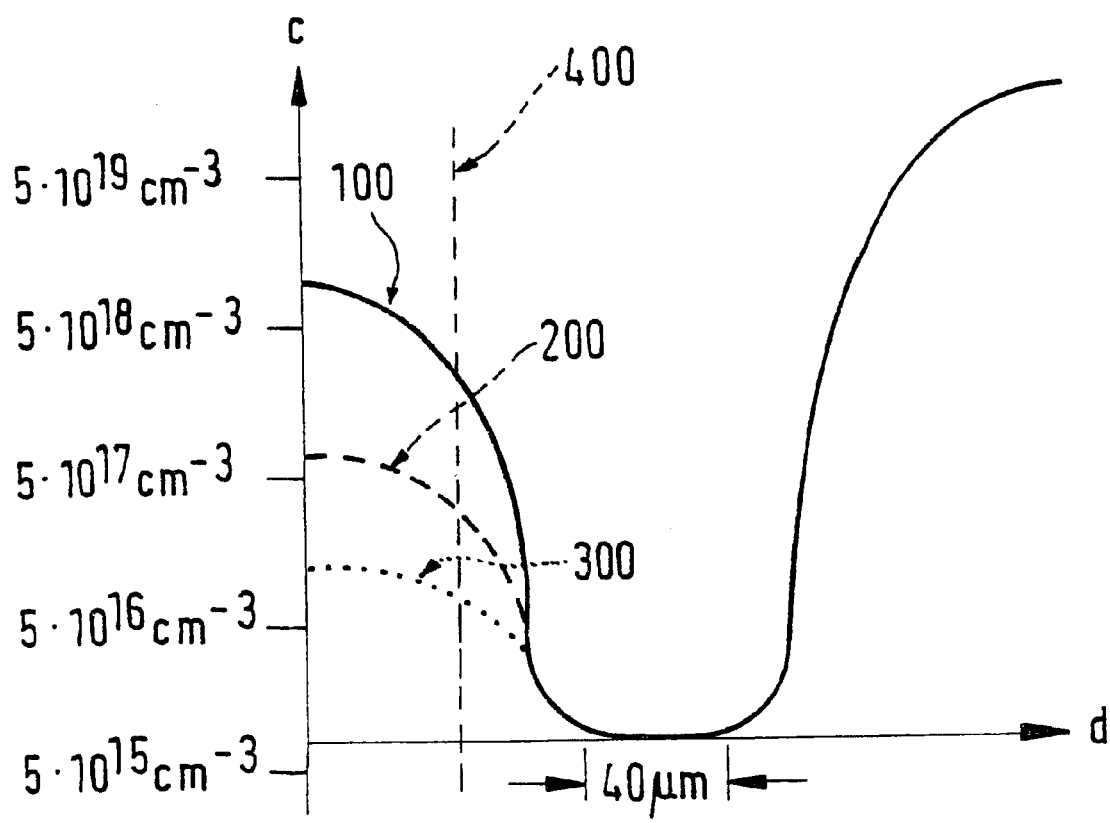
FIG. 4 depicts further doping concentration curves.

FIG. 4 depicts three doping concentration curves 100, 200, and 300 in a diagram of dopant concentration c as a function of location d (for definition of location d, compare FIG. 1). These profiles relate to the condition of a 200 micrometer thick wafer immediately after the method step depicted in FIG. 2b. Curve 100, for example, is provided for manufacturing Zener diodes having a Zener voltage between 19 and 25 volts, curves 200 and 300 are provided for Zener voltages between 34 and 40 volts and between 50 and 56 volts, respectively. In this context, area 4 of FIG. 1 corresponds to the zone marked in FIG. 4 having the width specification of 40 micrometers. This width, however, is insignificant for the setting of a preselected Zener voltage, and it can also have other values (typically 20 $\mu$m–120 $\mu$m).

Figure 2D:
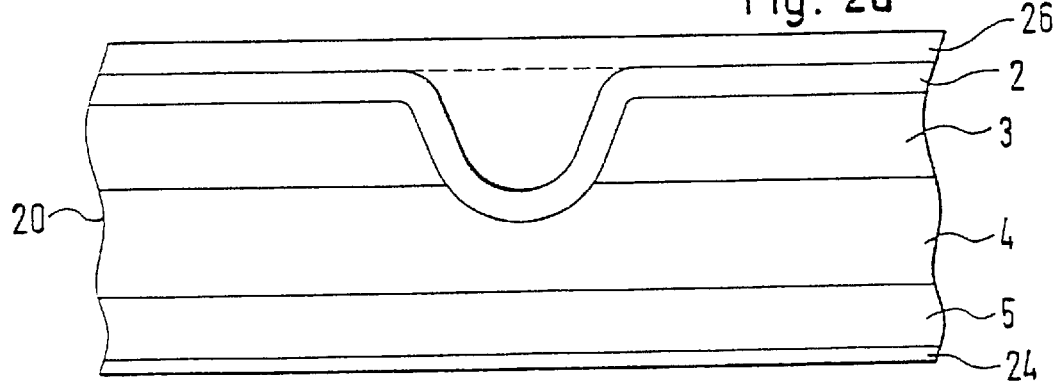
FIG. 2d depicts another method step for manufacturing.

Dotted line 400 marks the location of the pn junction produced in the method step of FIG. 2d, outside of deepened area 22.

The differing doping concentration curves depicted can be selected on the basis of the choice of a doping film 23 having an appropriate concentration of doping atoms in accordance with the Zener voltage desired. Alternatively, or in combination, the time of the covering of the wafer using doping film 23 can be varied, in order to vary the Zener voltage which will later result. The avalanche voltage in the edge area of the finished individual diodes then remains unaffected as a result of the trench structure and has always the value, for example, of 140 volts. Alternatively, or in combination with the selection of a doping film 23 that is doped at a lower level, in order to raise the Zener voltage, a doping film 26 that is doped at a higher level can be used in the manufacturing process.

Optionally, here too, the covering of the upper and lower side of wafer 20 using a strong or very strong concentration of n-doping atoms, instead of through using films (as depicted in FIG. 2a), can also take place through a gas-phase covering, a spin-on method using doping liquids, and/or through ion implantation or other generally known doping procedures.

What is claimed is:

1. A method for manufacturing a plurality of semiconductor arrangements, comprising the steps of:
    manufacturing a wafer including:
        an upper partial layer,
        a second partial layer located beneath the upper partial layer, and
        a third partial layer located beneath the second partial layer, wherein:
            the upper partial layer, the second partial layer, and the third partial layer have the same conduction type,
            a dopant concentration of the upper partial layer is larger than a dopant concentration of the second partial layer, and
            a dopant concentration of the third partial layer is greater than the dopant concentration of the upper partial layer and the dopant concentration of the second partial layer;
    introducing trenches into an upper side of the wafer, the trenches extending through the upper partial layer and into the second partial layer;
    introducing dopants on the upper side of the wafer to change a conductivity type of a first layer of the upper partial layer;
    applying a metallic coating on the upper side of the wafer and on a lower side of the wafer; and
    dividing the wafer into individual chips along the trenches, wherein the upper partial layer, the second partial layer, and the third partial layer are manufactured according to the steps of:
        covering the upper side of the wafer by a strong concentration of doping atoms,
        covering the lower side of the water by a very strong concentration of doping atoms,
        causing a driving-in of the doping atoms to occur,
        covering the upper side of the wafer by a neutral film, and
        covering the lower side of the wafer by a doping film for the very strong concentration of doping atoms.

2. The method according to claim 1, further comprising the step of:

covering the upper side of the wafer by a doping film for the strong concentration of doping atoms.

3. The method according to claim 1, wherein:

the step of covering the upper side of the wafer by the strong concentration of doping atoms and the step of covering the lower side of the wafer by the very strong concentration of doping atoms occur with respect to a gas-phase covering and in accordance with at least one of a spin-on operation employing a doping liquid and an ion implantation operation.

4. The method according to claim 1, wherein:

the step of covering the upper side of the wafer by the strong concentration of doping atoms includes the step of covering the upper side of the wafer by a further doping film in order to change the conductivity type of the first layer, and doping atoms of the further doping film have a conductivity type that is opposite that of the doping atoms of the doping film for the very strong doping.

5. The method according to claim 4, wherein:

the covering of the lower side with the doping film for the very strong doping and the covering of the upper side with the further doping film take place in wafer stacks, so that a front side and a rear side of each one of the doping film for the very strong doping and the further doping film in a stack interior come into contact with one of the upper side of the wafer and the lower side of the wafer.

6. The method according to claim 4, further comprising the steps of:

covering the upper side of the wafer by another doping film for the strong doping; and in order to set differing Zener voltages, performing one of the steps of:

changing one of the doping film for the strong doping and the further doping film with respect to a dopant concentration, and adjusting a covering time with respect to the further doping film.

7. The method according to claim 1, further comprising the step of:

simultaneously with the introduction of the dopants in the upper side of the wafer, performing, in order to change the conductivity type of the first layer, at least one of the steps of:

strengthening the doping concentration of the third partial layer, and enlarging a thickness of the third partial layer.

8. The method according to claim 7, wherein the steps of strengthening and enlarging include the step of:

covering the lower side of the wafer by the doping film for the very strong doping.

9. The method according to claim 1, wherein:

the step of introducing the trenches is performed in accordance with one of a cutting operation and an etching operation.

10. The method according to claim 9, further comprising the step of:

applying the wafer to a cutting film before a performance of the cutting operation.

11. The method according to claim 1, wherein:

each one of the steps of causing the driving-in of the doping atoms, covering the upper side of the wafer by the neutral film, and covering the lower side by the doping film for the very strong doping occurs one of before and after the step of introducing the trenches.

* * * * *